(12) United States Patent
Arakawa et al.

(10) Patent No.: US 7,304,250 B2
(45) Date of Patent: Dec. 4, 2007

(54) ELECTROMAGNETIC SHIELDING SHEET

(75) Inventors: Fumihiro Arakawa, Shinjuku-ku (JP);
Yasuhiko Ishii, Shinjuku-Ku (JP);
Daisuke Hashimoto, Shinjuku-ku (JP);
Yukihiro Kyoden, Shinjuku-Ku (JP);
Eiji Ohishi, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/519,454

(22) PCT Filed: Aug. 6, 2003

(86) PCT No.: PCT/JP03/10022

§ 371 (c)(1),
(2), (4) Date: Dec. 29, 2004

(87) PCT Pub. No.: WO2004/016060

PCT Pub. Date: Feb. 19, 2004

(65) Prior Publication Data

US 2006/0088690 A1    Apr. 27, 2006

(30) Foreign Application Priority Data

Aug. 8, 2002    (JP) .............................. 2002-230845

(51) Int. Cl.
*H05K 9/00*    (2006.01)
(52) U.S. Cl. ...................... 174/381; 174/389; 174/392; 313/479

(58) Field of Classification Search .............. 174/35 R, 174/35 MS, 389, 392, 381; 313/479; 430/321; 422/6
See application file for complete search history.

(56) References Cited

U.S. PATENT DOCUMENTS

| 6,599,681 | B2 * | 7/2003 | Gilson ........................ 430/321 |
| 7,193,779 | B2 * | 3/2007 | Kim et al. ................... 359/580 |
| 2001/0019236 | A1 * | 9/2001 | Hirota et al. ................ 313/110 |

FOREIGN PATENT DOCUMENTS

| DE | 1931200 A | * | 1/1970 |
| JP | 10-75087 | | 3/1998 |
| JP | 2001-217589 | | 8/2001 |
| JP | 2002-9484 | | 1/2002 |
| JP | 2002-185184 | | 6/2002 |
| JP | 2002-190692 | | 7/2002 |
| JP | 2003-249791 | | 9/2003 |
| JP | 2003-258484 | | 9/2003 |

* cited by examiner

*Primary Examiner*—Hung V. Ngo
(74) *Attorney, Agent, or Firm*—Oliff & Berridge, PLC

(57) ABSTRACT

An electromagnetic shielding sheet 1 includes: a transparent base 11, and at least an adhesive layer 13, an antirust layer 25A and a mesh metal layer 21 formed on one of the surfaces of the base. A blackened layer 23A is sandwiched between the mesh metal layer 21 and the antirust layer 25A. At least openings 105 of the mesh metal layer 21 are filled up with a resin such that the mesh metal layer 21 has a substantially flat surface.

6 Claims, 4 Drawing Sheets

ELECTROMAGNETIC SHIELDING SHEET

TECHNICAL FIELD

The present invention relates to a sheet for shielding electromagnetic radiation and, more specifically, to an electromagnetic shielding sheet provided with a meshed, thin metal foil (thin film), intended to be disposed in front of a display, such as a cathode-ray tube (CRT) or a plasma display panel (PDP), to shield electromagnetic radiation generated by the display, and capable of enabling the satisfactory visual recognition of images displayed by the display.

BACKGROUND ART

Summary of Techniques: Problems attributable to electromagnetic inference (EMI) have increased with the recent functional progress and spread of electric and electronic devices. Electromagnetic noise is classified roughly into conducted noise and radiated noise. Methods of preventing problems due to conducted noises filter conducted noise by a noise filter. Methods of preventing problems due to radiated noise use a metal case to shield a space electromagnetically, place a metal sheet between wiring board, or coat the wires of cables with a metal foil. Although effective in electromagnetically shielding circuits and power blocks, these methods are unsuitable for shielding electromagnetic radiation generated by the screens of displays, such as CRTs and PDP, because those methods use opaque means.

The PDP is an assembly of a glass panel provided with data electrodes and a fluorescent layer, and a glass panel provided with transparent electrodes. The PDP generates a large amount of electromagnetic radiation, a large amount of near-infrared radiation and a large amount of heat when operated. Usually, a front panel is disposed in front of the PDP to shield electromagnetic radiation. The front panel must have a shielding function of 30 dB or above in the range of 30 MHz to 1 GHz to shield electromagnetic radiation emitted from the screen of the display. Infrared radiation of wavelengths in the range of 800 to 1,100 nm radiated from the screen of the display must be shielded because infrared radiation makes other devices, such as a remote controller for the remote control of VTRs and air conditioners, malfunction. The electromagnetic shielding metal mesh (lines) of the electromagnetic shielding sheet should not deteriorate visibility and the electromagnetic shielding sheet must have proper transparency (visible light transmitting property, visible light transmittance) to make images displayed by the display satisfactorily visible.

Since the PDP is provided with a large screen, such as a 37 in. screen, a 42 in. screen or a larger one, the electromagnetic shielding sheet used in combination with the PDP has thousands of horizontal and vertical lines defining openings. Since parts of an adhesive layer are exposed in the openings of the electromagnetic shielding sheet, the adhesive layer exposed to the adverse effects of an etchant during etching is colored, and the adhesive layer is deteriorated by an alkaline resist remover for removing a resist film after etching.

Prior Art: To ensure improved visibility of displayed images, the front panel is required to have a uniform, stable mesh structure of electromagnetic shielding, having proper transparency (visible light transmittance), not colored in an undesired color and not subject to peeling.

A front panel having a mesh structure disclosed in JP 5-283889 A has the following structure: (base)/(transparent anchor layer)/(electromagnetic shielding layer). The electromagnetic shielding layer has a meshed pattern and is formed by an electroless plating process. A method of forming a metal mesh for an electromagnetic shielding sheet disclosed in JP 09-293989 A uses a photoresist process. An electromagnetic shielding structure disclosed in JP 10-335885 A is formed by laminating a plastic film provided with a copper foil formed in a geometrical pattern by photolithography to a plastic plate. Although those prior art electromagnetic shielding sheets formed by the prior art methods have a mesh structure, only the metal mesh is coated with an antirust layer, and the antirust layer is not formed over the entire base and the adhesive layer. The prior art methods mention nothing about forming the antirust layer over the entire base and the adhesive layer. Generally, the electromagnetic shielding sheet is disposed with the base facing the viewing side. Therefore, it is difficult to connect a grounding electrode of the electromagnetic shielding sheet to a ground.

An electromagnetic shielding sheet disclosed in JP 11-298185 having a structure (transparent base)/(black layer)/(patterned metal layer)/(antirust layer) is formed by a patterning method of forming a pattern (a meshed pattern, as in the present invention) that superposes a black layer and a patterned metal layer on a patterned resist film, washes off the black layer and the patterned metal layer together with the resist film, and then forms the antirust layer. However, the antirust layer cannot be formed between the transparent base and the black layer or the metal layer, or in openings. Furthermore the minute meshes cannot be precisely formed because the pattern (the meshed pattern) is not formed by an etching process. Parts of an adhesive layer or the base exposed in the openings to form transparent parts are colored or yellowed by the agency of an etchant used in the corroding process. Such colored parts affect the color tone of displayed images, and the coloring of those parts reduces the adhesive strength of the adhesive layer. In some cases, metal ions, such as $Fe^{3+}$ ions, contained in the etchant and penetrated into the adhesive layer and the base deteriorate coloring matters added to the adhesive for color correction and infrared ray absorption. When an electromagnetic shielding sheet is bonded to a transparent base or the screen of a display with an adhesive, bubbles B remain in the openings in the mesh structure as shown in FIG. 7, and light is scattered at the interface between the bubbles and the adhesive to increase haze value. A filter disclosed in JP 2000-227515 A is formed by laminating a near-infrared absorbing filter to the foregoing electromagnetic shielding sheet, and has both an electromagnetic shielding ability and a near-infrared absorbing property.

An electromagnetic shielding sheet fabricating method of fabricating this prior art filter needs an additional process for bonding the near-infrared absorbing filter to the electromagnetic shielding sheet with an adhesive.

DISCLOSURE OF THE INVENTION

The present invention has been made to solve the above problems and it is therefore an object of the present invention to provide an inexpensive electromagnetic shielding sheet disposed in front of a display, such as a CRT or a PDP, capable of shielding both electromagnetic radiation and near-infrared radiation, not subject to the increase of haze value due to bubbles remaining in an adhesive layer, and capable of ensuring the high visibility of displayed images.

According to the present invention, an electromagnetic shielding sheet includes: a transparent base; a transparent antrust layer formed on one of the surfaces of the base; and a mesh metal layer formed on the antirust layer and having lines defining openings; wherein the antirust layer extends over parts of the base corresponding to both the lines and the openings.

The electromagnetic shielding sheet according to the present invention is disposed in front of a display, such as a PDP, to shield electromagnetic radiation generated by the display, is provided with the mesh metal layer having invisible lines and having both an electromagnetic shielding ability and a transparency, may be disposed with either of the surfaces thereof facing a viewing side, has an adhesive layer and the base scarcely subject to discoloration and qualitative changes and deterioration, and not peeled off by an etching process and a resist film removing process during fabrication, and is capable of ensuring the high visibility of images for a long period of time.

In the electromagnetic shielding sheet according to the present invention, the lines of the mesh metal layer have a width in the range of 5 to 25 μm and are arranged at pitches in the range of 150 to 500 μm.

According to the present invention, the lines of the mesh metal layer are invisible and have both an electromagnetic shielding ability and a high transparency.

In the electromagnetic shielding sheet according to the present invention, a blackened layer is formed on one of the surfaces of the mesh metal layer.

According to the present invention, the lines of the mesh metal layer are invisible and enable images to be viewed in high visibility.

The electromagnetic shielding sheet according to the present invention further includes an additional antirust layer formed on one surface of the mesh metal layer opposite the other surface of the same facing the base.

The electromagnetic shielding sheet may be disposed with the surface of the base facing a PDP, reduces work for connecting electrodes, does not need any printed black frame, and does not glare to spoil the visibility of images.

In the electromagnetic shielding sheet according to the present invention, the openings in the mesh metal layer are filled up with a transparent resin such that the surface of the transparent resin is flush with the surface of the mesh metal layer.

Since the openings in the mesh metal layer are filled with the transparent resin, the electromagnetic shielding sheet is easy to handle.

In the electromagnetic shielding sheet according to the present invention, the transparent resin filling up the openings in the mesh metal layer contains a color tone correcting light-absorbing agent capable of absorbing visible light having wavelengths between 570 to 605 nm and/or a near-infrared-absorbing agent capable of absorbing infrared radiation having wavelengths between 800 to 1100 nm.

The electromagnetic shielding sheet according to the present invention further includes a layer of a color tone correcting agent capable of absorbing visible light having wavelengths in the range of 570 to 605 nm and/or a layer of a near-infrared-absorbing agent capable of absorbing near-infrared radiation having wavelengths in the range of 800 to 1100 nm formed on the outer surface of either the base or the additional antirust layer.

The electromagnetic shielding sheet according to the present invention shields both near-infrared radiation and electromagnetic radiation generated by the PDP to prevent problems due to near-infrared radiation and electromagnetic radiation, permits visible light to permeate, absorbs light of colors between yellow and orange in the emission spectrum of neon atoms generated by the PDP to prevent images from being colored in an orange color tone, and ensures the satisfactory visibility of displayed images.

BEST MODE FOR CARRYING OUT THE INVENTION

A preferred embodiment of the present invention will be described with reference to the accompanying drawings.

The present invention is not limited in its practical application to the embodiment specifically described herein.

Figure 1:
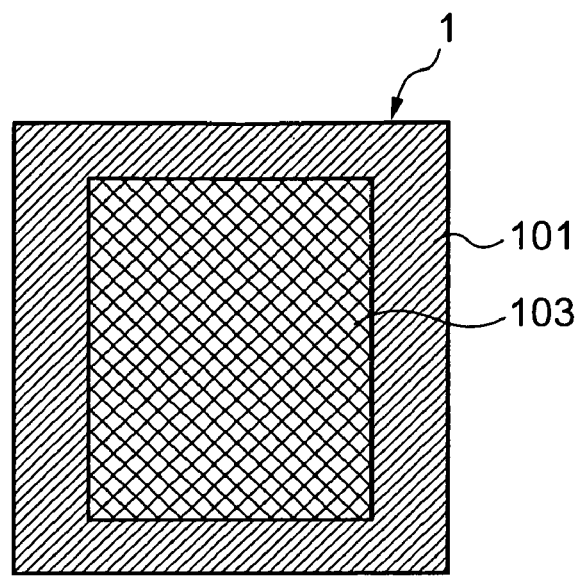
FIG. 1 is a plan view of an electromagnetic shielding sheet according to the present invention.

FIG. 1 is a plan view of an electromagnetic shielding sheet according to the present invention.

Figure 2:
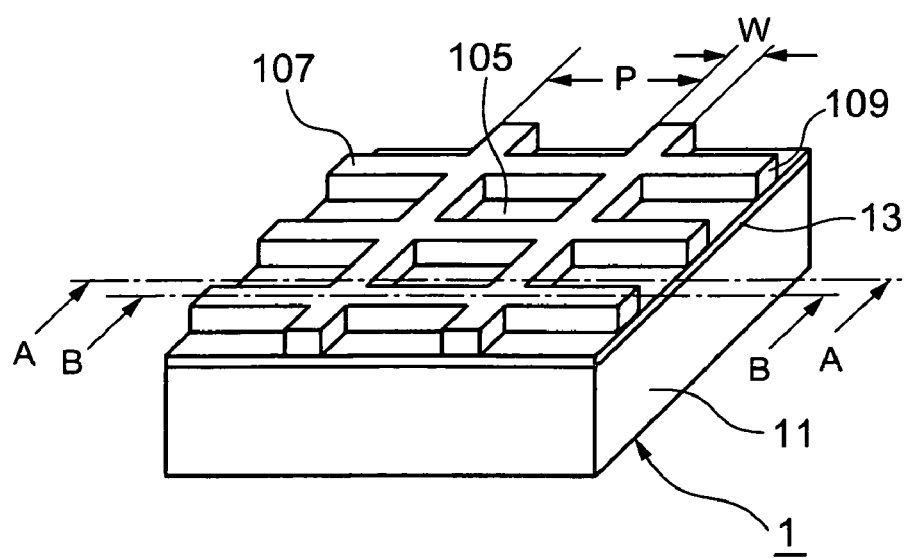
FIG. 2 is a partial, typical perspective view of the electromagnetic shielding sheet according to the present invention.

FIG. 2 is a partial, typical perspective view of the electromagnetic shielding sheet according to the present invention.

General Construction: Referring to FIG. 1, an electromagnetic shielding sheet 1 according to the present invention includes a transparent base 11, a mesh structure 103 formed on the base 11, and a grounding frame 101 surrounding the mesh structure 103. As shown in FIG. 2, the mesh structure 103 has intersecting lines 107 defining a plurality of openings (cells) 105. The grounding frame 101 is grounded when the electromagnetic shielding sheet 1 is combined with a display.

The lines 107 are bonded to one surface of the transparent base 11 with an adhesive layer 13. The lines 107 are formed by processing a laminated conductive structure 109. When the conductive structure 109 can be formed directly on the base 11 by electroless plating or vacuum evaporation, the adhesive layer 13 may be omitted. The lines 107 intersect each other to form openings 105 in a close arrangement in a plane.

Thus, the mesh structure 103 has the lines 107 and the openings 105. As shown in FIG. 2, the width of the lines 107 is referred to as line width W, and the distance between the similar edges of the adjacent lines 107 is referred to as pitch P.

Figure 3A:
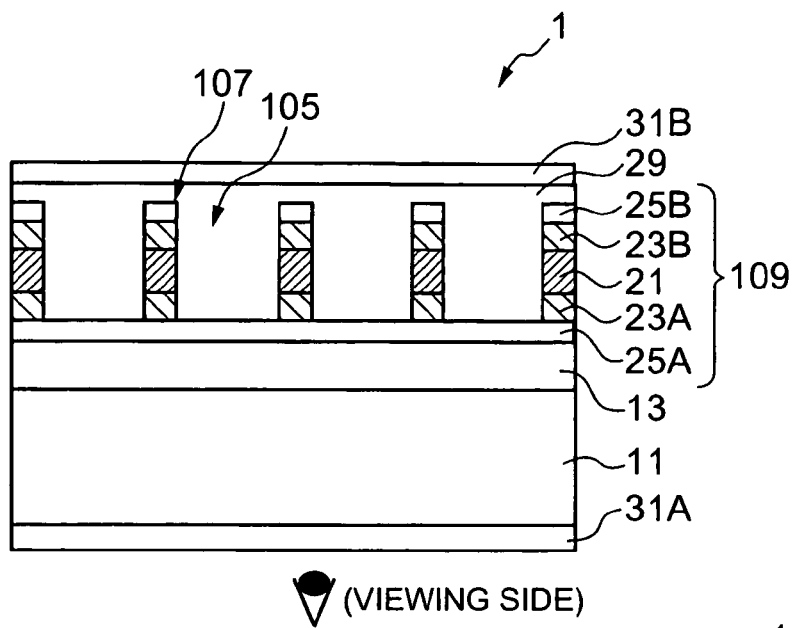
FIG. 3A is a sectional view taken on the line A-A in FIG. 2.
Figure 3B:
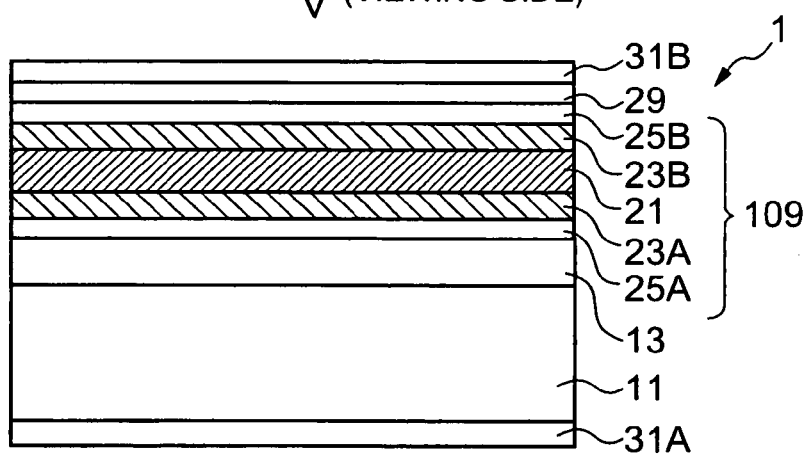
FIG. 3B is a sectional view taken on the line B-B in FIG. 2.

FIGS. 3A and 3B are sectional views taken on the lines A-A and B-B in FIG. 2, respectively.

Figure 4:
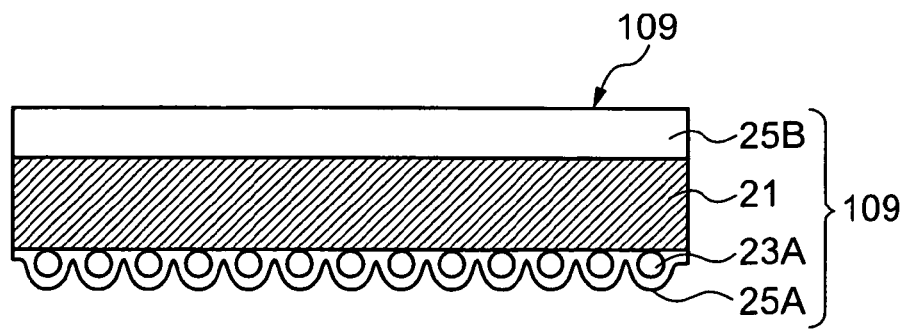
FIG. 4 is a sectional view of assistance in explaining the construction of a conductive structure.

FIG. 4 is a sectional view of assistance in explaining the construction of the conductive structure.

Construction of Conductive Structure:

As shown in FIG. 3A showing a section in a plane crossing the openings 105, the openings 105 and the lines 107 are arranged alternately. As shown in FIG. 3B showing a section in a plane including the line 107, the continuous line 107 is formed from the conductive structure 109. As shown in FIGS. 3A, 3B and 4, the conductive structure 109 has a metal layer 21 and, preferably, at least a blackened layer 23A or 23B formed on a surface of the metal layer 21 facing a viewing side. More preferably, the conductive structure 109 has an antirust layer 25A and/or an antirust layer 25B formed on the blackened layer 23A and/or the blackened layer 23B. An antirust layer may be formed at least on the blackened layer 23A. The antirust layer 25A that extend also in the openings 105 of the mesh structure is transparent. The antirust layer 25B formed only on the lines 107 of the mesh structure may be either transparent or opaque.

The antirust layers 25A and 25B prevent the metal layer 21 and the blackened layers 23A and 23B from rusting, and prevent the blackened layers 23A and 23B from coming off. The antirust layers 25A and 25B protects the adhesive layer 13 adhesively bonding the conductive structure 109 to the base 11. When necessary, the blackened layer 23B and the antirust layer 25B, i.e., an additional antirust layer 25B, may be formed on the other surface of the metal layer 21, and the blackened layer 23A and 23B and the antirust layers 25A and 25B may be formed on both the surfaces of the metal layer 21, respectively. Most preferably, the blackened layer 23A and the antirust layer 25A are formed on the surface of the metal layer 21 facing the viewing side.

POINTS OF THE INVENTION

In a prior art technique, the metal layer 21 and the antirust layer are etched to leave only parts of the antirust layer 25A on the lines 107. In the present invention, the metal layer 21 is etched so that parts of the antirust layer 25A also remain on the base 11 in the openings 105 of the mesh structure. Thus, the antirust layer 25A extending over the entire surface of the base 11 protects the adhesive layer 13. According to the prior art technique, parts of the adhesive layer 13 exposed in the openings 105. The exposed parts of the adhesive layer 13 are exposed to the adverse effects of an etchant during etching and are colored, the adhesive layer 13 is deteriorated and altered by an alkaline resist remover for removing a resist film after etching and, consequently, the adhesive strength of the adhesive layer 13 decreases. According to the present invention, the adhesive layer 13 is protected from the foregoing adverse effects of etching and the associated processes by the antirust layer 25A. Thus, the antirust layer 25A can prevent the contamination of the adhesive layer 13 with iron and sodium contained in the etchant, and prevents the discoloration and fading of the light-absorbing agent.

In most cases, the electromagnetic shielding sheet 1 is disposed with its base 11 facing the viewing side. In the electromagnetic shielding sheet 1 of the present invention, the antirust layer 25A is formed on the blackened layer 23A or, when necessary, the antirust layers 25A and 25B of the same quality are formed on both the blackened layers 23A and 23B. Since the blacking layer 23B formed on the surface of the metal layer 21 not facing the base is protected by the antirust layer 25B, particles contained in the blackened layer 23B do not come off easily. Thus, electromagnetic shielding sheet 1 may be disposed with either of the opposite surfaces thereof facing the viewing side. If the electromagnetic shielding sheet 1 is disposed with the metal layer 21 facing the viewing side, the grounding frame 101 (an electrode in function) is exposed, the grounding frame 101 can be easily connected to a ground. The very thin antirust layer (additional antirust layer) 25B and the very thin blackened layer 23B do not obstruct grounding. The grounding frame 101 is formed by a blackening treatment. The grounding frame 101 may be formed simultaneously with the blackened layer 23A or 23B by a blackening treatment for forming the blackened layer 23A or 23B, which reduces processes and costs.

Although the electromagnetic shielding sheet 1 is supposed to be used in combination with a display, such as a CRT or a PDP herein, naturally, the electromagnetic shielding sheet 1 can be used for electromagnetic shielding in combination with an apparatus other than displays.

The PDP is featured by its large screen. The dimensions of the electromagnetic shielding sheet 1 are on the order of 620 mm×830 mm for a 37 in. screen, and on the order of 580 mm×980 for a 42 in. screen. The electromagnetic shielding sheet 1 can be formed in greater dimensions. Usually, the respective numbers of the horizontal and the vertical lines of the electromagnetic shielding sheet are several thousands. The lines must be formed in a predetermined region in the line width W in an accuracy on the order of micrometers. A person viewing images displayed by the display feel a feeling of very strong wrongness if parts of the electromagnetic shielding sheet 1 corresponding to the openings 105 are colored in an undesired color. In the electromagnetic shielding sheet of the present invention, the transparent antirust layer 25A extending over the entire surface of the mesh structure including the openings 105 prevents the adhesive layer 13 or the base 11 from being colored, and has an electromagnetic shielding ability and a moderate transparency. Thus, the electromagnetic shielding sheet of the present invention ensures the excellent visibility of displayed images. The antirust layer 25A has a refractive index different from that of the adhesive layer 13 or a flattening layer 29. The refractive index of the antirust layer 25A is relatively large, the refractive index of the adhesive layer 13 or the flattening layer 29 is relatively small. Thus, it is expected that the antirust layer 25B exercises optical effects, such as an antireflection effect and a contrast enhancing effect.

The laminated conductive structure 109 of the electromagnetic shielding sheet 1 includes the metal layer 21, the blackened layer 23A and/or the blackened layer 23B formed at least on one of the surfaces of the metal layer 21, and the antirust layer 25A and/or the antirust layer 25B forming the surface of the conductive structure 109 facing the base 11. The antirust layer 25A extends over the entire surface of the base 11 including parts corresponding to the lines and the openings.

The conductive structure 109 is subjected to a photolithographic process to form the mesh structure after being bonded to the transparent base 11 with the adhesive layer 13. Then, a transparent resin is spread over the mesh structure to form the flattening layer 29 filling up the openings 105 and having a flat outer surface. Light-absorbing layers 31A and 31B capable of absorbing near-infrared radiation having wavelengths in a specific wave band, or near-infrared radiation and visible light having wavelengths in a specific wave band are formed on the surfaces of the base 11 and the flattening layer 29 when necessary. The electromagnetic shielding sheet disposed in front of the display shields electromagnetic radiation and near-infrared radiation generated by the display. The adhesive layer does not contain any bubbles that cause haze and whitening, the mesh structure has a uniform density, black or white spot defects and lines are very few, the electromagnetic shielding sheet has moderate transparency, and displayed images are visible in satisfactory visibility.

Figure 8:
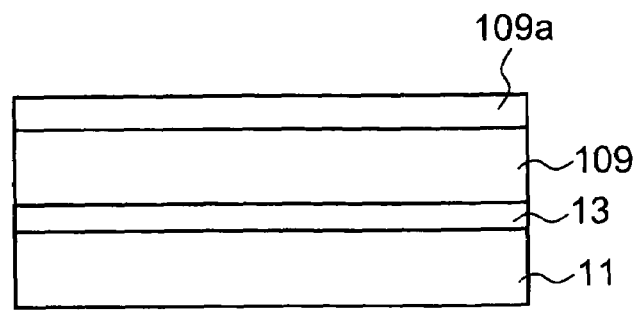
FIG. 8 is a view of assistance in explaining a method of fabricating an electromagnetic shielding sheet.

Fabricating Method:

In fabricating the electromagnetic shielding sheet 1 of the present invention, the conductive structure 109 provided at least with the blackened layer on the viewing side, and the antirust layer on the side of the base 11 is fabricated. The conductive structure 109 is laminated to one of the surfaces of the base 11, i.e., a transparent film, with the adhesive, and a resist film 109a having a meshed pattern is formed over the conductive structure 109. A photolithographic process is carried out to remove parts of the conductive structure 109 not coated with the resist film 109a excluding the antirust layer 25A by etching and then the resist film 109a is removed. The electromagnetic shielding sheet can be fabricated by existing fabricating apparatuses and most of the processes can be successively carried out. Thus, the electromagnetic shielding sheet can be fabricated in a high quality at a high yield rate and at a high production efficiency (FIG. 8).

Materials of the layers of the electromagnetic shielding sheet 1 of the present invention will be described.

Conductive Structure:

The conductive structure 109 for shielding electromagnetic radiation has the metal layer 21 formed of a metal having a conductivity sufficient for shielding electromagnetic radiation, such as gold, silver, copper, iron, nickel or chromium. The metal layer 21 may be a single layer or a laminated layer, and may be formed of an alloy. Iron base metals suitable for forming the metal layer 21 are low-carbon steels, such as low-carbon rimmed steels and low-carbon aluminum-killed steels, Ni—Fe alloys, and Invar. When cathodic electrodeposition is used, copper or copper alloy foils are desirable. The copper foils may be rolled copper foils and electrolytic copper foils. Electrolytic copper foils are preferable because electrolytic copper foils have a uniform thickness, have a satisfactory property to adhere to blackened layers and/or layers formed by a chromate treatment, and are capable of being formed in thin films of a thickness not greater than 10 μm. The thickness of the metal layer 21 is in the range of about 1 to about 100 μm, preferably, in the range of 5 to 20 μm. Although the metal layer 21 can be easily processed by photolithography to form the mesh structure if the thickness of the metal layer 21 is less than the lower limit of the thickness range, a mesh structure formed by processing the metal layer 21 having such a small thickness has a large electrical resistance that reduces the electromagnetic shielding effect. If the metal layer 21 has a thickness greater than the upper limit of the thickness range, a desired fine mesh structure cannot be formed and, consequently, the mesh structure has a low real ratio of open area and a low transmittance, visual angle decreases, and the visibility of images becomes low. The metal layer 21 is formed beforehand and is bonded to the base 11 with the adhesive layer 13. The metal layer 21 may be formed directly on the base 11 by an electroless plating process, an electroless plating and an electrolytic plating process or a vacuum deposition process. The adhesive layer 13 can be omitted when the metal layer 21 is formed directly on the base 11.

Preferably, the metal layer 21 has a surface roughness Rz between 0.5 to 10 μm. The metal layer 21 reflects external light in a specular reflection mode deteriorating the visibility of images if the surface roughness thereof is below 0.5 μm even if the surface of the metal layer 21 is blackened. The adhesive and the resist cannot be uniformly spread over the entire surface of the metal layer 21, bubbles are formed in the adhesive and the resist if the surface roughness of the metal layer 21 is greater than 10 μm. The surface roughness Rz is the mean of roughness values of ten points measured by a surface roughness measuring method specified in B0601, JIS.

Blackening Treatment:

The surface, facing the viewing side, of the metal layer 21 of the meshed conductive structure 109 needs to be processed by a blackening treatment to improve the visibility of images and to increase contrast in images by absorbing external light falling on the electromagnetic shielding sheet 1. The blackening treatment roughens and/or blackens the surface of the metal layer 21. The blackening treatment can be achieved by any one of various methods. For example, the blackening treatment can form a metal oxide or a metal sulfide over the surface of the metal layer 21. If the metal layer 21 is formed of iron, an oxide film (blackening film) of a thickness between 1 to 2 μm is formed by exposing the metal layer 21 to steam of a temperature in the range of 450° C. to 470° C. for a period in the range of 10 to 20 min. An oxide film (blackening film) may be formed by chemically processing the metal layer 21 with a chemical, such as concentrated nitric acid. If the metal layer 21 is a copper foil, it is preferable to attach cationic particles to the metal layer 21 by an electrodeposition process using an electrolytic solution containing sulfuric acid, copper sulfate and cobalt sulfate. The cationic particles adhering to the surface of the metal layer 21 increases the surface roughness of the metal layer and blackens the surface of the metal layer 21. The cationic particles may be copper particles or copper alloy particles. Copper-cobalt alloy particles are preferable.

In this specification, the blackening treatment includes roughening and blackening. Preferably, a preferable blackening density is 0.6 or above. Blackening density is measured by using COLOR CONTROL SYSTEM GRETAG SPM100-11® (Kimoto Co.). Measurement of the blackening density of a specimen uses an angle of observation field of 10°, a light source D50, and an illumination type T specified in the ANSI standards. The blackening density of the specimen is measured after white calibration. Preferably, the reflectance of the surface processed by the blackening treatment is 5% or below. Reflectance is measured by using Haze Meter HM150® (Murakami Sikisai) by a method specified in K7105, JIS.

Alloy Particles:

The cationic particles may be copper particles or copper alloy particles. Preferably, the cationic particles are copper-cobalt alloy particles. Copper-cobalt alloy particles can improve blackening degree remarkably and absorb visible light satisfactorily. The optical characteristics representing the image visibility improving effect of the electromagnetic shielding sheet are expressed by the color system "$L^*$, $a^*$, $b^*$, $\Delta E^*$" specified in Z8729, JIS. The conductive structure 109 becomes more invisible when the absolute values of $a^*$ and $b^*$ are smaller. Consequently, contrast in images is enhanced and the visibility of images is improved. The effect on decreasing the values of $a^*$ and $b^*$ of the copper-cobalt alloy particles, as compared with that of copper particles, is high. The copper-cobalt alloy particles are able to reduces the values of $a^*$ and $b^*$ near to zero.

Preferably, the mean particle size of the copper-cobalt alloy particles is in the range of 0.1 to 1 μm. Copper-cobalt alloy particles having a mean particle size exceeding the upper limit of the desired range reduces the thickness of the metal layer 21 excessively and, consequently, it is possible that the copper foil is broken in laminating the same to the base 11, and the surface of the metal layer 21 lacks fineness and has an uneven appearance because the particles are not formed compactly. Copper-cobalt particles having a mean particle size below the lower limit of the range lack roughening effect and hence the visibility of images is unsatisfactory.

Antirust Layer:

The antirust layer 25A and/or the antirust layer 25B is formed at least on the blackened layers 23A and 23B formed by blackening the metal layer 21 to prevent the metal layer 21 and/or the blackened layers from rusting and to prevent the blackened layers from coming off and being deformed. The antirust layers 25A and 25B may be layers of oxides of nickel and/or zinc and/or copper or layers formed by a chromate treatment. The layers of oxides of nickel and/or zinc and/or copper can be formed by a known plating process. The thickness of the layers of oxides of nickel and/or zinc and/or copper is in the range of about 0.001 to about 1 µm, preferably, in the range of 0.001 to 0.1 µm.

Chromate Treatment:

The chromate treatment treats a workpiece with a chromating solution. The chromating solution may be applied to the workpiece by a roll-coating method, a curtain-coating method or a squeeze-coating method. The workpiece may be wetted with the chromating solution by a dipping method. The workpiece treated by the chromate treatment is dried without rinsing. A coating method, such as a roll-coating method, is preferable when only one of the surfaces of the workpiece is to be treated by the chromate treatment. A dipping method is preferable when both the surfaces of the workpiece are to be treated by the chromate treatment. Usually, the chromating solution is a $CrO_2$ solution having a $CrO_2$ concentration of 3 g/l. A chromating solution obtained by adding an oxycarboxylic compound to a chromic anhydride solution to reduce part of hexavalent chromium into tervalent chromium may be used. The surface of the workpieces treated by the chromate treatment is colored in a color of a color category including light yellow and yellowish brown depending on the amount of deposited hexavalent chromium. Since tervalent chromium is colorless, a film formed by the chromate treatment has practically acceptable transparency when the ratio between the respective amounts of tervalent chromium and hexavalent chromium is controlled properly. Suitable oxycarboxylic compounds are tartaric acid, malonic acid, citric acid, lactic acid, glycolic acid, glyceric acid, tropic acid, benzilic acid and hydroxyvalerianic acid. Those chemicals may be used individually or in combination. Since the different compounds have different reducing effects, the amount of the compound added to the chromic anhydride solution must be determined according to the rate of reduction of hexavalent chromium into tervalent chromium.

More concretely, suitable chromating agents are, for example, ALSURF 100® commercially available from Nippon Paint Co. and PM-284® commercially available from Nippon Parkerizing Co. The chromate treatment is particularly effective in enhancing the effect of the blackening treatment.

The blackened layers 23A and 23B may be formed at least on the viewing side, and the antirust layers 25A and 25B may be formed at least on the side of the base 11. Contrast is improved to improve the visibility of displayed images. The blackened layers 23A and 23B and the antirust layers 25A and 25B may be formed on the side of the display. Thus stray light emitted by the display can be shielded to improve the visibility of images.

Subsequently, the transparent base 11 is bonded to the antirust layer 25A with the adhesive layer 13.

Base:

The base 11 may be formed of any one of various materials, provided that the materials have desired transparency, desired insulating property, desired heat resistance and desired mechanical strength. Suitable materials for forming the base 11 are, for example, polyester resins including polyethylene terephthalate resins, polybutylene terephthalate resins, polyethylene naphthalate resins, polyethylene terephthalate-isophthalate copolymers, terephthalate-cyclohexanedimethanol-ethylene glycol copolymers and polyethylene terephthalate/polyethylene naphthalate resins for coextrusion, polyamide resins including nylon 6, nylon 66 and nylon 610, polyolefin resins including polypropylene resins and poly(methyl pentene) resins, vinyl resins including polyvinyl chloride resins, acrylic resins including polyacrylate resins, polymethacrylate resins and poly(methylmethacrylate) resins, imide resins including polyimide resins, polyamidimide resins and poly(etherimde) resins, engineering plastics including polyarylate resins, polysulfone resins, poly(ether sulfone) resins, polyphenylene ether resins, polyphenylene sulfide resins (PPSs), polyaramid resins, poly(ether ketone) resins, polyether nitrile resins, poly (ether ether ketone) resins and polyether sulfide resins, and styrene resins including polycarbonate resins and polystyrene resins.

The base 11 may be formed of a copolymer containing some of the foregoing resins as principal components, a mixture of some of the foregoing resins or an alloy of some of the foregoing resins. The base 11 may be a laminated sheet. Although the base 11 may be either an oriented film or an unoriented film, it is preferable, in view of mechanical strength, that the base 11 is a uniaxially oriented film or a biaxially oriented film. The thickness of the base 11 is in the range of about 12 to about 1000 µm, preferably, in the range of 50 to 700 µm. The most desirable thickness of the base 11 is in the range of 100 to 500 µm. If the base 11 is excessively thin, the base 11 has an insufficient mechanical strength and warps or sags. If the base 11 is excessively thick, the base 11 has an over quality and is uselessly expensive.

The base 11 is a film, a sheet or a board having at least one layer of one of those resins. In this specification, a film, a sheet and a board will be referred to inclusively as "film". Polyester films, such as polyethylene terephthalate films and polyethylene naphthalate films, are suitable films as the base 11 because polyester films are satisfactory in transparency and heat resistance and inexpensive. Polyethylene terephthalate films are most suitable. Although films having higher transparency are more desirable, films having a transparency of 80% or above are acceptable.

The surface of the base 11 may be altered by surface treatment to render the surface receptive to the adhesive layer 13. The surface treatment may be corona discharge treatment, plasma treatment, ozone treatment, flame treatment, coating with a primer, i.e., anchoring agent, adhesion promoting agent or adhesive receptivity improving agent, preheating, dust removing treatment, deposition treatment or alkali treatment. When necessary, the resin film may contain additives, such as a filler, a plasticizer and an antistatic agent.

Laminating Process:

The adhesive layer 13 formed on one of the surfaces of the conductive structure 109, the adhesive layer 13 is dried if necessary, and the base 11 is hot-pressed or cold-pressed against the surface of the conductive structure 109 coated with the adhesive layer 13 to bond the base 11 to the conductive structure 109 with the adhesive layer 13. When necessary, the assembly of the base 11 and the conductive structure 109 may be subjected to aging at a temperature in the range of 30° C. to 80° C. When the base 11 or the outermost layer of the laminated base 11 is formed of a heat-adhesive resin, such as an ionomer, an ethylene-vinyl acetate copolymer, an ethylene-acrylic acid copolymer or an ethylene-acrylate copolymer, the base 11 can be bonded to the conductive structure 109 simply by hot-pressing.

Adhesive:

The adhesive layer 13 may be formed of any suitable resin, such as an acrylic resin, a polyester resin, a urethane resin, an epoxy resin or a polyvinyl chloride-acetate resin. Dry lamination using a thermosetting resin having satisfactory processability and resistant to the coloring and deteriorative effects of an etchant is preferable. An ionizing-radiation-curable resin that can be cured with ionizing radiation, such as ultraviolet radiation or electron beams, is preferable. Suitable ionizing-radiation-curable resins are, for example, prepolymers (or oligomers) including polyester (meth)acrylate resins, urethane (meth)acrylate resins and epoxy (meth)acrylate resins, monomers including trimethylolpropane trimethacrylate resins and dipentaerythritol hexamethacrylate resins and mixtures of some of those resins. In this specification, "(meth)acrylate" signifies acrylate or methacrylate.

Dry Lamination:

A dry lamination process for laminating two films forms adhesive layers on the films by applying an adhesive solution prepared by dissolving an adhesive in a solvent to the films and drying the adhesive solution, laminates the films to form a laminated film, subjects the laminated film to aging at a temperature in the range of 30° C. to 120° C. for several hours to several days to cure the adhesive. A nonsolvent lamination process developed by improving the dry lamination process may be employed. The nonsolvent lamination process can spread an adhesive instead of the adhesive solution over films, dry the adhesive, laminate the films in a laminated film and subjects the laminated structure to aging at a temperature in the range of 30° C. to 120° C. for several hours to several days to cure the adhesive so that the films are bonded together.

An adhesive suitable for the dry lamination process or the nonsolvent lamination process is a thermosetting adhesive or an ionizing-radiation-curable adhesive that can be cured with ionizing radiation, such as ultraviolet radiation or electron beams. Suitable thermosetting adhesives are two-part adhesives, such as urethane adhesives including polyester-urethane adhesives, polyether-urethane adhesives and acryl-urethane adhesives, acrylic adhesives, polyester adhesives, polyamide adhesives, polyvinyl acetate adhesives, epoxy adhesives and rubber adhesives. Two-part urethane adhesives are preferable.

A suitable two-part urethane adhesive is, for example, an aromatic polyisocyanate, such as tolylenediisocyanate, diphenylmethane diisocyanate or polymethylene polyphenylene polyisocyanate, or two-part urethane resin obtained by reacting polyfunctional isocyanate, i.e., aliphatic or alicyclic polyfunctional isocyanate, such as hexamethylene diisocyanate, xylylene diisocyanate or isophorone diisocyanate, with a hydroxyl-terminated compound, such as polyether polyol, polyester polyol or polyacrylate polyol.

Preferable adhesive is obtained by mixing a polyester polyurethane resin denatured by a styrene-maleic acid copolymer resistant to the coloring and deteriorative effects of an etchant, and an aliphatic polyisocyanate resin.

The dry lamination process can dissolve or disperse an adhesive composition containing the foregoing materials as principal components in an organic solvent to produce an adhesive liquid, coat a film with a film of the adhesive liquid by a coating method, such as a roll coating method, a reverse-roll coating method, a gravure roll coating method, a gravure reverse-roll coating method, a gravure offset coating method, a kiss coating method, a wire bar coating method, a comma coating method, a knife coating method, a dip coating method, a flow coating method or a spray coating method, and dry the film of the adhesive liquid to remove the solvent. A roll coating method or a reverse-roll coating method is preferable.

The thickness of the dry adhesive layer 13 is in the range of about 0.1 to about 20 μm, preferably, in the range of 1 to 10 μm. The base 11 is laminated to the laminated conductive structure 109 immediately after the formation of the adhesive layer 13, and a laminated structure thus formed is subjected to aging at a temperature in the range of 30° C. to 120° C. for several hours to several days to cure the adhesive layer 13 so that the base 11 and the laminated conductive structure 109 are bonded together. The adhesive layer 13 may be formed on either the base 11 or the laminated conductive structure 109. Preferably, the adhesive layer 13 is formed on the copper foil so as to cover the roughened surface of the copper foil entirely to prevent formation of bubbles in the laminated structure.

Although the nonsolvent lamination process and the dry lamination process are basically the same, the nonsolvent lamination process uses the adhesive composition directly without dissolving or dispersing the adhesive composition in a solvent. When necessary, the adhesive composition is heated to decrease the viscosity of the adhesive composition.

Adhesive:

The adhesive may be a known pressure-sensitive adhesive. There are not particular restrictions on the adhesive. The adhesive may be any one of suitable resins. Suitable adhesives are natural rubber, synthetic rubbers including butyl rubbers, polyisoplene rubbers, polyisobutylene rubbers, polychloroprene rubbers and styrene-butadiene copolymers, silicone resins including dimethyl polysiloxane resins, acrylic resins, vinyl acetate resins including polyvinyl acetate resins and ethylene-vinyl acetate copolymers, urethane resins, acrylonitrile resins, hydrocarbon resins, alkylphenol resins, and rosin resins including rosin, rosin triglyceride reins and hydrogenated rosin.

Rubber Adhesive:

Effective rubber adhesives are mixtures each of one or some of adhesives including chloroprene rubber, nitrile rubber, acrylic rubber, styrene-butadiene rubber, styrene-isoprene-styrene rubber, styrene-butadiene-styrene rubber, styrene-ethylene-butadiene rubber, butyl rubber, polyisobutylene rubber, natural rubber and polyisoprene rubber, and one or some of tackfiers including phenol resins, modified phenol resins, ketone resins, alkyd resins, rosin resins, coumarone resins, styrene resins, petroleum resins and vinyl chloride reins.

The rubber adhesives are superior to acrylic adhesives in chemical resistance, swelling resistance, heat resistance, tackiness and peeling strength. Therefore, layers bonded with the rubber adhesive will not peel off even if the same are exposed to acid or alkali solutions. The rubber adhesive is scarcely subject to hydrolysis in acid or alkali solutions, and maintains its adhesive property for a long time.

Adhesive Layer:

A latex, an aqueous dispersion or an organic solution of one or some of the foregoing resins is spread in an adhesive film on the surface of one of two layers to be bonded together by a known printing method, such as a screen printing method or a comma coating method, or a known coating method, the adhesive film is dried when necessary, and then the other layer is pressed against the former layer.

Figure 5A:
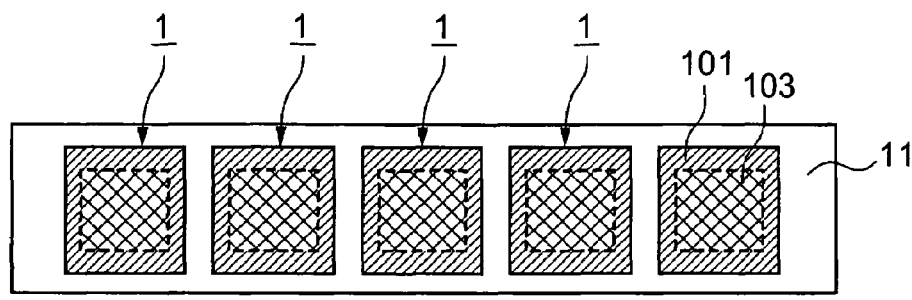
FIG. 5A is a plan view of assistance in explaining a method of processing a rolled continuous film.
Figure 5B:
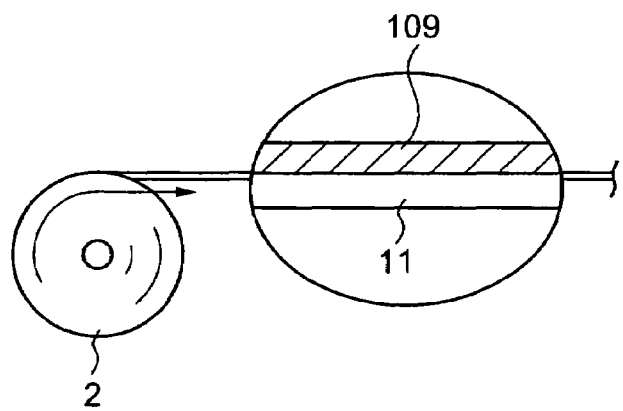
FIG. 5B is a side elevation of assistance in explaining the method of processing a rolled continuous film.
Figure 6:
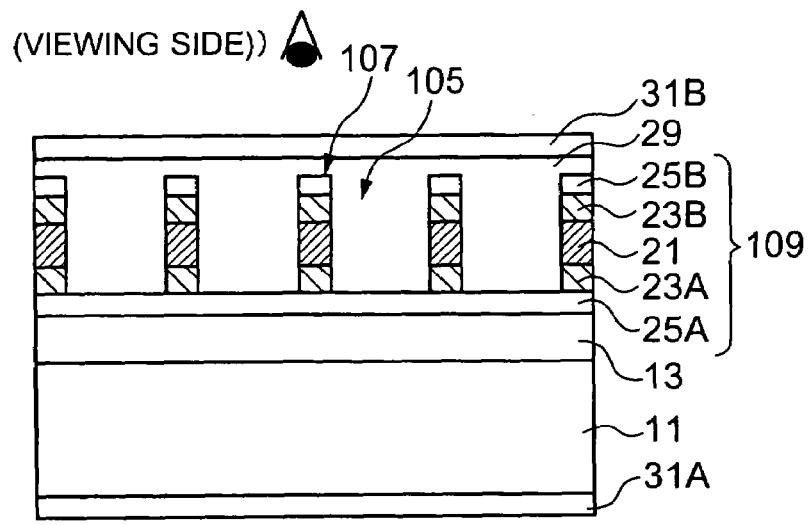
FIG. 6 is a sectional view of an electromagnetic shielding sheet according to the present invention to be applied to the screen of a display.

FIGS. 5A and 5B are a plan view and a side elevation, respectively, of assistance in explaining a method of processing a rolled continuous film.

A roll of the continuous film is used for forming laminated structures. In FIG. 5, the electromagnetic shielding sheets 1 are formed at predetermined intervals on the continuous film unwound from a roll. FIG. 5B shows the conductive structure 109 laminated to the base 11. The conductive structure 109 is formed by forming the antirust layer 25B, the blackened layer 23B, the metal layer 21, the blackened layer 23A and the antirust layers 25A in that order on the continuous film unwound from a roll. The adhesive layer 13 is formed on the antirust layer 25A of the conductive structure 109 by spreading an adhesive in an adhesive film to the surface of the antirust layer 25A and drying the adhesive film. The conductive structure 109 is bonded to the base 11 by pressing the same against the base 11. When necessary, a laminated structure formed by bonding together the conductive structure 109 and the base 11 is aged (cured) at a temperature in the range of 30° C. to 80° C. for several hours to several days, and the laminated structure is wound in a roll 2.

Photolithography:

As shown in FIG. 8, a resist film 109a having a predetermined meshed pattern is formed on the conductive structure 109 of the laminated structure, parts of the conductive structure 109 not coated with the resist film 109a are removed by etching, and the resist film 109a is removed to complete a meshed laminated structure.

Masking:

The conductive structures 109 of the continuous laminated structure formed by bonding together the base 11 and the conductive structures 109 and unwound from a roll are processed by photolithography to form meshed conductive structures 109. The continuous laminated structure is processed for masking, etching and resist film removal while the same is kept taut and fed continuously or intermittently.

Masking can form, for example, the photoresist film 109a over the entire surface of the conductive structure 109 of the laminated structure, dry the photoresist film 109a, put a mask having a predetermined pattern on the photoresist film 109a, expose the photoresist film 109a through the mask in the predetermined pattern of lines defining meshes. If the photoresist forming the photoresist film 109a is a negative resist film, i.e., a resist that becomes resistant to a developer when exposed to light, the meshed pattern is formed so as to cover parts of the conductive structure 109 corresponding to the openings and to expose parts of the same corresponding to the lines. If the photoresist forming the photoresist film 109a is a positive resist, i.e., a resist that becomes dissolvable in a developer, the mesh pattern is formed so as to cover parts of the conductive structure 109 corresponding to the lines and to expose parts of the same corresponding to the openings. Light emitted by a mercury lamp is used for exposure. The exposed photoresist film 109a is developed, subjected to a hardening process and a baking process.

The resist film 109a is formed on the surface of the conductive structure 109 by applying the resist, such as casein, a PVA or gelatin, to the surface of the conductive structure 109 by a dipping method, a curtain coating method or a flow coating method while the laminated structure formed by laminating the base 11 and the conductive structures 109 is unwound from a roll and fed continuously or intermittently. The resist film 109a may be formed by attaching a dry resist film to the conductive structure 109 instead of applying the liquid resist to the conductive structure 109. The baking temperature is in the range of 200° C. to 300° C. when a casein resist is used. It is preferable to bake the laminated structure at the lowest possible temperature to prevent the laminated structure from warping.

Etching Process:

The resist film 109a is etched after masking the same with the mask. A ferric chloride solution and a cupric chloride solution, which are easy to circulate, are preferable for a continuous etching process. Basically, the etching process is similar to an etching process using a shadow mask forming system for etching a continuous thin steel sheet of a thickness in the range of 20 to 80 μm to form shadow masks for CRTs of color TV sets. The etching process can be carried out by an existing shadow mask forming system, and a series of steps from a masking step to an etching process can be very efficiently continuously carried out. The laminated structure is washed with water, the resist film is removed with an alkali solution, the laminated structure is washed again, and then the laminated structure is dried.

Coloring Preventing Effect:

An etchant is sprayed on the entire surface of the laminated structure, and all the layers including the metal layer 21 are exposed to the corrosive action of the etchant. After the openings 105 have been formed, the adhesive layer 13 is exposed to the etchant and hence it is possible that the adhesive layer 13 is colored with the etchant. If the adhesive layer 13 is colored, L*, a* and b* of color tone expressed by color system "L*, a*, b*, ΔE*" specified in Z 8729, JIS increase and deteriorate the visibility of images.

The present invention can leave the antirust layer 25A on the side of the base 11 in the openings 105 as well as on the lines 107 to protect the adhesive layer 13 by the antirust layer 25A form the corrosive action of the etchant. Consequently, the adhesive layer 13 is not colored and hence the visibility of images is not deteriorated. Adhesion of the conductive structure 109 to the flattening layer 29 is not decreased.

Peeling Preventing Effect:

It is possible that the adhesive layer 13 is caused to come off due to the agency of the alkali solution when the alkali solution is used for removing the resist film 109a after etching. Since parts of the antirust layer 25a remain in the openings 105 of the meshed pattern, the adhesive layer 13 is protected by the antirust layer 25A from the adverse effect of the alkaline resist removing solution.

Contamination Preventing Effect:

Usually, the adhesive layer 13 is contaminated with iron and sodium contained in the etchant. The antirust layer 25A protects the adhesive layer 13 from contamination with the etchant. The surface of the electromagnetic shielding sheet 1 with the adhesive layer 13 not contaminated with iron and sodium is free from wetting that sometimes occurs when the electromagnetic shielding sheet 1 is disposed in front of a display in a hot, humid environment, and have an excellent appearance. Although the reason why the electromagnetic shielding sheet 1 has such properties is not definitely known, it is inferred that the antirust layer 25A containing a metal oxide as a principal component has a high surface tension and has high wettability. The formation of the antirust layer 25A also in the openings 105a provides special functions and effects.

Mesh structure:

The mesh structure 103 has the lines 107 defining the openings 105. There are not particular restrictions on the shape of the openings 105. The openings 105 may have a triangular shape, such as the shape of an equilateral triangle or an isosceles triangle, a quadrilateral shape, such as the shape of a square, a rectangle, a rhombus or a trapezoid, a polygonal shape, such as the shape of a pentagon, a hexagon or an octagon, a circular shape or an elliptic shape. The openings 105 form a mesh.

The width W of the straight parts of the lines 107 of the mesh structure 103 is within C(1±30%), where C is a predetermined value, and the radius of curvature of a side surface extending between the upper and the lower side of a bank in a section of the lines 107 in a plane perpendicular to the transparent sheet 11, i.e., the side surface surrounding the openings 105, is in the range of 1.5 to 3.0 times the thickness of the metal layer in view of ratio of open area, mesh invisibility and image visibility. Preferably, the width W of the lines 107 of the mesh structure 103 is between 5 and 25 μm, and the pitches between the lines 107 are between 150 to 500 μm. The width of a peripheral part of the mesh structure 103 may correspond to between 1 to 50 meshes or lines 107 in a peripheral part of a width between 0.15 to 15 mm may have a width outside the foregoing range of C(1±30%).

Generally, an electromagnetic shielding sheet for a large plasma display panel has thousands of intersecting straight lines. The lines 107 are formed such that the widths thereof are distributed within a desired width range and the radius of the side surface of a bank extending between the upper and the lower side of a section in a plane perpendicular to the transparent sheet 11 is controlled. The electromagnetic shielding sheet 1 meeting those conditions has an electromagnetic shielding ability, a proper transparency, uniformly arranged meshes, a few black and white spot defects and linear defects, a surface that does not glare or suppresses the reflection of external light, and enables images to be seen in excellent visibility.

The range of distribution of widths of the lines 107 having, for example, a nominal line width of 14 μm is between 9.8 to 18.2 μm. When the widths of the lines 107 are within this range, the lines 107 do not form meshes in an irregular density, and do not form undesirable black and/or white spot defects and linear defects. If the widths of the lines 107 are distributed in an excessively wide width range, the meshes are formed in an irregular mesh density. Parts, in which the lines 107 have an excessively wide width, of the electromagnetic shielding sheet form undesirable black spot defects, and parts, in which the lines 107 have an excessively narrow width, of the electromagnetic shielding sheet form undesirable white spot defects. White and/or black spot defects make the viewer feel a very strong feeling of wrongness.

The laminated structure 103 of the electromagnetic shielding sheet 1 of the present invention is formed by a continuous photolithographic process, has the lines having widths within the predetermined width range. Therefore, meshes of the mesh structure 103 are not formed in an irregular mesh density, and the electromagnetic shielding sheet 1 has a satisfactory electromagnetic shielding ability and a proper transparency. The irregular mesh density, the black and/or white spots and the linear defects are formed if a spray of the resist adheres to parts other than those to be coated with the resist. Such a trouble rarely occurs in the continuous photolithographic process.

A peripheral part contiguous with the circumference of the mesh structure 103 may be excluded from those for which the width W of the lines 107 is controlled. That is, the grounding frame 101 formed of the metal layer 21 and surrounding the mesh structure 103 does not have any lines 107 and, in some cases, end parts of the lines 107 in the peripheral part are widened toward the grounding frame 101. The width of the peripheral part of the mesh structure 103 corresponds to between 1 to 50 meshes or is between 0.15 to 15 mm, preferably, corresponds to between 1 to 25 meshes or is between 0.3 to 7.5 mm.

A suitable resist is selected and conditions of the etching process are determines so as to form the lines 107 such that the radius of curvature of a side surface extending between the upper and the lower side of a bank in a section of the lines 107 in a plane perpendicular to the transparent sheet 11 is in the range of 1.5 to 3.0 times the thickness of the metal layer and the width W of the lines 107 of the mesh structure 103 is within the range of C(1±30%), where C is a predetermined value. For example, it is desirable that a dry resist or a liquid resist is used, an etchant having a Baumé degree of 35° or above is used, a ferric chloride solution or a cupric chloride solution heated at 35° C. or above is used as the etchant, the etchant is splayed at a spraying rate of 2000 ml/min or above, and a spray nozzle is oscillated in a vertical or horizontal plane.

The radius of curvature and the line width of the lines 107 can be easily controlled by forming the lines of the pattern in a width greater than the line width of the lines 107 to increase the amount of parts to be etched and etching the laminated structure 109 at a low etch rate.

The radius of curvature of a side surface extending between the upper and the lower side of a bank is estimated from the lengths of sides of an electron micrograph, taken at a 2000× magnification, of the line 107 in a specimen obtained by slicing the electromagnetic shielding sheet in a plane perpendicular to the transparent base 11 with a microtome in a slice, and coating the slice with a platinum-palladium alloy by sputtering. The section of banks formed by etching does not necessarily have a truly circular shape. The line representing the side surface of the bank may be a line similar to the circumference of a substantially circular shape or an inclined side of a trapezoid.

In brief, it is desired that the radius of curvature of a line segment extending between the respective right ends of the upper and the lower side or a line segment extending between the respective left ends of the upper and the lower side is between 1.5 to 3.0 times the thickness of the metal layer. The radius of curvature does not necessarily need to be fixed and may be varied, provided that the same is within the range of 1.5 to 3.0 times the thickness of the metal layer.

Although the lines 107 shown in FIG. 1 are bias lines inclined to the lower side of the electromagnetic shielding sheet at 45°, the angle of the lines 107 to the lower side is not limited thereto and may be selectively determined taking into consideration the light emitting characteristic of the associated display and the arrangement of pixels to prevent the formation of moiré.

Flattening:

the lines 107 of the mesh structure have a height corresponding to the thickness of the metal layer 21, and parts of the metal layer 21 are removed to form the openings 105. The openings 105 are recesses surrounded by the lines 107. Thus, the conductive structure 109 has an irregular surface. When an adhesive (or a pressure-sensitive adhesive) is applied to the irregular surface of the conductive structure 109 by the next process, the openings 105 are filled up with the adhesive. If the conductive structure 109 is attached to the surface of a member, such as the screen of a display, immediately after the formation of the mesh structure, the irregular surface having the exposed recesses obstruct work for applying the conductive structure 109 to the member, it is possible that bubbles are contained in the openings 105, the interfaces between the bubbles and the adhesive scatter light to increase haziness and whitening. Therefore, it is desirable to flatten the surface of the conductive structure 109 by filling up the recesses.

The recesses are filled up with a transparent resin for flattening. Bubbles are contained in the transparent resin to decrease transparency unless the recesses are filled up completely with the transparent resin. Therefore, a transparent resin diluted with a solvent and having a low viscosity is applied to the surface of the conductive structure 109 in a resin film, and the resin film is dried to form the flattening layer 29, or the resin is applied to the surface of the conductive structure 109, deaerating the same to form the flattening layer 29.

The flattening layer 29 may be formed of any suitable resin, provided that the resin has a high transparency, and sufficiently adhesive to the metal forming the mesh structure and to an adhesive to be used by the next process. If projections or recesses are formed in the surface of the flattening layer 29 and the surface of the flattening layer undulates, the flattening layer 29 exercises an unsatisfactory bubble-eliminating effect when an adhesive is applied to the surface of the flattening layer 29 and the flattening layer 29 is attached to a holding member 32. If the surface of the flattening layer 29 is not satisfactorily flat, moiré, interference fringes and/or Newton rings are formed when the electromagnetic shielding sheet is disposed in front of a display. It is preferable to apply a thermosetting or UV-curable resin diluted by a solvent and having a low viscosity to the conductive structure 109 so that the recesses forming the openings 105 are filled up completely and a resin layer is formed, to remove the solvent from the resin layer by drying, to attach a flat release sheet to the surface of the resin layer, to cure the resin layer by heating or irradiation with UV radiation, and to remove the release sheet from the cured resin layer. The flat surface of the release sheet is transferred to the flattening layer 29 to form a flat surface. The release sheet is, for example, a biaxially oriented polyethylene terephthalate film coated with a releasing layer of a silicone resin.

The flattening layer 29 may be formed of any suitable resin, such as a natural resin, a synthetic resin, a thermosetting resin or an ionizing-radiation-curable resin. In view of durability, applicability and flattening property, suitable materials for forming the flattening layer 29 are prepolymers or oligomers including urethane (meth)acrylate resins, polyester (meth)acrylate resins, and epoxy (meth)acrylate resins, monomers including trimethylolpropane (meth)acrylate resins, dipentaerythritol hexa(meth)acrylate resins, and UV-curable resins prepared by mixing some of those prepolymers and the monomers.

Near-infrared-absorbing Agent:

Preferably, the resin forming the flattening layer 29 contains a near-infrared-absorbing agent capable of absorbing near-infrared radiation in a specific wave band. The flattening layer 29 containing the near-infrared-absorbing agent absorbs near-infrared radiation in the specific wave band to shield the near-infrared radiation radiated by the display so that apparatuses controlled by near-infrared radiation emitted by remote controllers or the like may not malfunction due to the near-infrared radiation. The specific wave band of the wavelengths of near-infrared radiation is between about 780 to about 1200 nm. It is particularly desirable to absorb 80% or above of near-infrared radiation having wavelengths in a wave band of 800 to 1100 nm. Any suitable near-infrared-absorbing agent may be used. A suitable near-infrared-absorbing agent is, for example, a coloring matter having peak electromagnetic absorption wavelengths in the near-infrared wave band, a high light transmittance in the visible region and not having a specific peak electromagnetic absorption wavelength in the visible region. Suitable near-infrared-absorbing agents are phthalocyanine compounds, immonium compounds, di-immonium compounds and dithiol metal complex compounds. Although those near-infrared-absorbing agents may be individually used, it is preferable to use a blend of some of those near-infrared-absorbing agents. For example, a blend of a di-immonium compound and a phthalocyanine compound is used. Usually, visible light emitted by a PDP contains a large amount of orange light having a spectrum corresponding to the emission spectrum of neon atoms. Therefore, it is desirable that the flattening layer 29 contains a color tone correcting light-absorbing agent that absorbs some of visible light having wavelengths in the range of about 570 to about 605 nm. Coloring matters meeting such a requirement include cyanine compounds, phthalocyanine compounds, naphthalocyanine compounds, naphthoquinone compounds, anthraquinone compounds and dithiol complexes. Either the near-infrared-absorbing agent or the color tone correcting light-absorbing agent, or both the near-infrared-absorbing agent and the color tone correcting light-absorbing agent are added to the material forming the flattening layer 29 as the occasion demands.

Near-Infrared-Absorbing Layer:

The light-absorbing layers 31A and 31B capable of absorbing near-infrared radiation are formed on the surfaces of the base 11 and the flattening layer 29, respectively, or the light-absorbing layer 31A and/or 31B is formed on the surface of the base 11 and/or the surface of the flattening layer 29. The light-absorbing layer 31A is formed on the surface of the base 11, and the light-absorbing layer 31B is formed on the surface of the flattening layer 29 as shown in FIG. 1. The light-absorbing layers 31A and 31B may be near-infrared-absorbing films on the market, such as Film No. 2832 commercially available from Toyobo, bonded to the base 11 and the flattening layer 29 with an adhesive or may be films of a binder containing the aforesaid near-infrared-absorbing agent. Suitable binders include polyester resins, polyurethane resins, acrylic resins and thermosetting or UV-curable resins utilizing the reaction of epoxy groups, acrylate groups, methacrylate groups or isocyanate groups.

Figure 7:
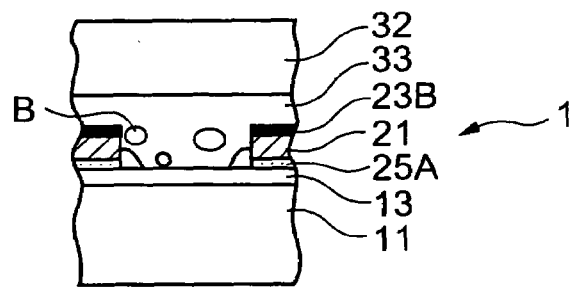
FIG. 7 is a sectional view of an electromagnetic shielding sheet provided with a cover.

Generally, the electromagnetic shielding sheet of the present invention is laminated to the holding member 32 with an adhesive layer. The holding member 32 is a transparent substrate (protective layer or a reinforcing layer), a functional sheet with an antireflection layer, a hard coating layer, an antifouling layer and/or an antiglare layer or the screen of a display. The holding member 32 may be on the side of either the base 11 or the conductive structure 109. Holding members 32 may be on the side of both the base 11 and the conductive structure 109. In FIG. 7, the holding member 32 is bonded to the conductive structure 109 with an adhesive layer 33. In forming the adhesive layer 33, an adhesive must be carefully spread over the surface of the conductive structure 109 so that air filling the openings is completely replaced with the adhesive and any bubbles B may not be locked in the adhesive filling up the openings. Locking of bubbles B in the adhesive layer 33 can be prevented by forming the flattening layer 29 on the conductive structure 109 and coating the surface of the flattening layer 29 with the adhesive.

Antireflection Layer:

An antireflection layer may be formed on a surface, on the viewing side, of the electromagnetic shielding sheet. The antireflection layer prevents reflecting visible light. There are various commercially available single-layer and multiple-layer antireflection films. A multiple-layer antireflection film consists of alternate high-diffraction and low-diffraction layers. Suitable high-diffraction layers are those of niobium oxide, titanium oxide, zirconium oxide and ITO. Suitable low-diffraction layers are those of silicon oxide, magnesium fluoride and such. Some antireflection film has a layer having a minutely roughened surface that reflects external light in a diffused reflection mode.

Hard Coating Layer, Antifouling Layer, Antiglare Layer:

A hard Coating layer, an antifouling layer and an antiglare layer may be formed on the antireflection layer. The hard coating layer has a hardness not lower than a hardness H determined by a pencil hardness test method specified in K 5400, JIS. The hard coating layer is formed by heating or irradiating with ionizing radiation a film of a polyfunctional (meth)acrylate resin, such as a polyester (meth)acrylate resin, a urethane (meth)acrylate resin or an epoxy (meth) acrylate resin. The antifouling layer is a water-repellent, oil-repellent coating of a siloxane compound or a fluorinated alkylsilyl compound. The antiglare layer has a minutely roughened surface capable of reflecting external light in a diffused reflection mode.

Cutting:

A continuous base sheet on which electromagnetic shielding structures are formed is unwound from a roll and the continuous base sheet is cut to provide individual electromagnetic shielding sheets 1. A front plate for a display is formed by attaching the electromagnetic shielding sheet 1 to a holding member, i.e., a transparent substrate of glass or a resin. When necessary, an antireflection layer, a hard coating layer, an antifouling layer and/or an antiglare layer is laminated to the electromagnetic shielding sheet 1. A rigid transparent substrate of a thickness in the range of 1 to 10 mm is used for forming a front panel for a large display. A resin film of a thickness in the range of 0.01 to 0.5 mm is used as a transparent substrate for forming a front panel for a small display, such as a character indicator or the like. Thus, a proper transparent substrate is used selectively according to the size and use of the display. The electromagnetic shielding sheet 1 may be directly applied to the screen of a display.

Direct Application:

Direct application of the electromagnetic shielding sheet 1 to the screen of a display will be described. The electromagnetic shielding sheet 1 is attached to the screen of a display with the mesh metal layer facing the viewing side, and at least a blackened layer is formed on the metal layer. When the electromagnetic shielding sheet 1 is thus attached to the display, the grounding frame 101 is exposed and can be easily connected to a ground. The flattening layer 29 is not formed over the grounding frame 101. The very thin antirust layer 25B and the very thin blackened layer 23B do not obstruct grounding the grounding frame 101. Since the grounding frame 101 is processed by the blackening process and faces the viewing side, the front glass plate does not need any printed, black frame, which reduces processes and has an advantageous effect on cost reduction.

Examples will be described.

EXAMPLE 1

A 10 µm thick electrolytic Cu foil was used as a conductive structure 109 including a metal layer 21. Blackened layers 23A and 23B of Co—Cu alloy particles having a mean particle size of 0.3 µm, and chromated layers 25A and 25B were formed on the Cu foil. A 100 µm thick transparent, biaxially oriented PET film A4300® (Toyobo) as a base was laminated to the chromated surface of the Cu foil with a two-part polyurethane adhesive. A structure formed by laminating the PET film and the Cu foil was aged at 56° C. for four days. The two-part adhesive includes TAKERAKKU A-310® (polyol) (Takeda Yakuhin Kogyo) as an adhesive resin, and Hardener A-10® (isocyanate) (Takeda Yakuhin Kogyo) as a hardener. The two-part adhesive was spread in a 7 µm thick film in a dry state. The chromating process used a 0.1% ALSURF 1000® (Nippon Paint) solution as a chromating solution. The structure was immersed in the chromating solution heated at 40° C. for 1 min, the chromated structure was washed and the washed, chromated structure was dried at 80° C. for 10 min.

The structure formed in a continuous laminated film was masked and etched by a photolithographic process. The photolithographic process was carried out by a shadow mask manufacturing line for manufacturing shadow masks for color TV sets. A photoresist film of casein was formed over the entire surface of the conductive structure of the laminated film by a flow coating method. The laminated film was delivered to the next station. The laminated structure was exposed to light emitted by a mercury lamp through a photomask having a pattern for forming 22 µm wide lines defining square openings, arranged at pitches of 300 µm and inclined at 49°, and 5 mm wide grounding parts. The laminated structure was processed at the following stations for developing, hardening and burning at 80° C.

Subsequently, parts of the Cu foil and those of the blackened layer corresponding to the openings were removed by an etching process using a ferric chloride solution heated at 40° C. and having a Baumé degree of 40° as an etchant by a spray etching method having a side etching effect. Thus, the openings were formed without etching the chromated layer on the side of the base. The laminated film was processed by the following processes at the following stations for washing, resist film removal, rinsing and drying at 80° C. to complete electromagnetic shielding sheets in Example 1.

EXAMPLE 2

Electromagnetic shielding sheets in Example 2 were the same as those in Example 1, except that the chromated layers of the electromagnetic shielding sheets in Example 2 contained zinc oxide.

EXAMPLE 3

Electromagnetic shielding sheets in Example 3 were the same as those in Example 1, except that the electromagnetic shielding sheets in Example 3 were provided with nickel oxide layers formed by plating instead of the chromated layers.

EXAMPLE 4

Electromagnetic shielding sheets in Example 4 were the same as those in Example 1, except that the electromagnetic shielding sheets in Example 4 were provided with nickel oxide layers and zinc oxide layers formed by plating instead of the chromated layers.

EXAMPLE 5

Electromagnetic shielding sheets in Example 5 were the same as those in Example 1, except that the electromagnetic shielding sheets in Example 5 were provided with nickel oxide layers, zinc oxide layers and copper oxide layers formed by plating instead of the chromated layers.

COMPARATIVE EXAMPLE 1

Electromagnetic shielding sheets in Comparative example 1 were the same as those in Example 1, except that the electromagnetic shielding sheets in Comparative example 1 were not provided with any layer corresponding to the chromated layer 25A on the side of the base 11 of the electromagnetic shielding sheets in Example 1.

EXAMPLE 6

Electromagnetic shielding sheets in Example 6 were fabricated by the steps of coating the surfaces of the mesh structures of the electromagnetic shielding sheets in Example 1 with a film of a flattening composition, laminating a 50 μm thick SP-PET20-BU® (Tosero), i.e., a PET film having a surface having a release characteristic, to the surface of the film of the flattening composition, exposing the thus coated electromagnetic shielding sheets to radiation of an intensity of 200 mj/cm$^2$ (in terms of 365 nm) emitted by a high-pressure mercury lamp, and removing the SP-PET20-BU. The electromagnetic shielding sheets in Example 6 had a flattening layer of the flattening composition filling up the openings of the mesh structures.

The flattening composition was prepared by mixing 20 parts by mass of N-vinyl-2-pyrrolidone, 25 parts by mass dicyclopentenyl acrylate, 52 parts by mass oligoester acrylate (M-8060®, Toa Gosei), and 3 parts by mass 1-hydroxycyclohexyl phenylketone (IRUGACURE 184, ciba-Geigy).

EXAMPLE 7

Electromagnetic shielding sheets in Example 7 were the same as those in Example 6, except that a flattening composition used by Example 7 contained 1 part by mass thiol-nickel complex in addition to the components of the flattening composition used by Example 6.

EXAMPLE 8

Electromagnetic shielding sheets in Example 8 were the same as those in Example 6, except that NIR Film No. 2832® (Toyobo), i.e., a near-infrared absorbing film, was laminated to the flattening layer with an adhesive.

EXAMPLE 9

Electromagnetic shielding sheets in Example 9 were the same as those in Example 1, except that the electromagnetic shielding sheets in Example 9 were not provided with any layer corresponding to the chromated layer of Cu—Co alloy particles, and were provided with a PET film laminated thereto and a flattening layer similar to that of Example 6.

The electromagnetic shielding sheets in Examples 1 to 9 and Comparative Example 1 were mounted on PDPs. The visibility of images displayed by the PDP was evaluated through the visual observation of the displayed images, and near-infrared absorbing abilities of the electromagnetic shielding sheets were measured.

Images displayed by the PDPs provided with the electromagnetic shielding sheets in Examples 1 to 8 did not glare, white and/or black spot defects and linear defects were not found in the images, images did not haze (whitened), and the visibility of the images was satisfactory. Near-infrared transmittances in the wave band of 800 to 1100 nm measured by a spectral transmittance recorder were less than 20%. When the electromagnetic shielding sheet in Example 9 was attached to the PDP with the base adhesively bonded to the surface of the PDP, an insignificant amount of stray light rays was produced by reflecting light emitted by the PDP, the surface of the PDP did not glare, the visibility of images displayed by the PDP was satisfactory, work for connecting the electrode was reduced and the glass substrate did not need any printed black frame.

The adhesive layers of Examples 1 to 9 were analyzed by Fluorescent X-ray Spectroscope RIX3000® (Rigaku) to measure Fe and Na. The adhesive layers did not contain Fe and Na at all. Parts corresponding to the openings were neither clouded nor colored. Any abnormalities did not occur when the PDPs provided with the electromagnetic shielding sheets in Examples 1 to 9 were operated continuously for ten hours.

Parts, corresponding to the openings, of the electromagnetic shielding sheets in Comparative example 1 were clouded slightly, images displayed by the PDPs provided with the electromagnetic shielding sheets in Comparative example 1 had low contrast, and the visibility of images was unsatisfactory.

The electromagnetic shielding sheets of the present invention are disposed in front of displays, such as CRTs and PDPs to shield electromagnetic radiation generated by the displays, the invisible lines of the mesh structure have both an electromagnetic shielding ability and a high transparency. The electromagnetic shielding sheets of the present invention can be used with either of its opposite surfaces facing the viewing side and enable satisfactory visual observation of displayed images.

The invention claimed is:

1. An electromagnetic shielding sheet comprising:
    a transparent base;
    a transparent antirust layer formed on one of the surfaces of the base; and
    a mesh metal layer formed on the antirust layer and having lines defining openings;
    wherein the antirust layer extends over parts of the base corresponding to both the lines and the openings, and the openings in the mesh metal layer are filled up with a transparent resin such that the surface of the transparent resin is flush with the surface of the metal layer.

2. The electromagnetic shielding sheet according to claim 1, wherein the lines of the metal layer have a width in the range of 5 to 25 μm and are arranged at pitches in the range of 150 to 500 μm.

3. The electromagnetic shielding sheet according to claim 1, wherein a blackened layer is formed on one of the surfaces of the metal layer.

4. The electromagnetic shielding sheet according to claim 1 further comprising an additional antirust layer formed on one surface of the metal layer opposite the other surface of the same facing the base.

5. The electromagnetic shielding sheet according to claim 4 further comprising a layer of a color tone correcting agent capable of absorbing visible light having wavelengths in the range of 570 to 605 nm and/or a layer of a near-infrared-absorbing agent that absorbs near-infrared radiation having wavelengths in the range of 800 to 1100 nm formed on the outer surface of either the base or the additional antirust layer.

6. The electromagnetic shielding sheet according to claim 1, wherein the transparent resin filling up the openings in the mesh metal layer contains a color tone correcting light-absorbing agent capable of absorbing visible light having wavelengths in the range of 570 to 605 nm and/or a near-infrared-absorbing agent capable of absorbing infrared radiation having wavelengths in the range of 800 to 1100 nm.

* * * * *